(12) United States Patent
Clinton et al.

(10) Patent No.: US 8,724,367 B2
(45) Date of Patent: May 13, 2014

(54) METHOD AND APPARATUS PERTAINING TO A FERROELECTRIC RANDOM ACCESS MEMORY

(75) Inventors: Michael Patrick Clinton, Allen, TX (US); Steven Craig Bartling, Plano, TX (US); Scott Summerfelt, Garland, TX (US); Hugh McAdams, McKinney, TX (US)

(73) Assignee: Texas Instruments Incorporated, Dallas, TX (US)

( * ) Notice: Subject to any disclaimer, the term of this patent is extended or adjusted under 35 U.S.C. 154(b) by 305 days.

(21) Appl. No.: 13/243,875

(22) Filed: Sep. 23, 2011

(65) Prior Publication Data

US 2012/0170350 A1    Jul. 5, 2012

Related U.S. Application Data

(60) Provisional application No. 61/428,627, filed on Dec. 30, 2010.

(51) Int. Cl.
*G11C 11/22* (2006.01)

(52) U.S. Cl.
USPC ......................................... 365/145

(58) Field of Classification Search
CPC ........................................ G11C 11/22

USPC ............... 365/49.13, 65, 109, 117, 145, 148; 257/295, E21.208, E21.663, E21.664, 257/E27.104, E29.164; 438/3

See application file for complete search history.

(56) References Cited

U.S. PATENT DOCUMENTS

| | | | |
|---|---|---|---|
| 2003/0142565 A1* | 7/2003 | McClure | 365/201 |
| 2005/0135143 A1* | 6/2005 | Jeon | 365/145 |
| 2006/0028889 A1* | 2/2006 | Liaw | 365/209 |
| 2007/0008765 A1* | 1/2007 | Takashima | 365/145 |
| 2007/0121367 A1* | 5/2007 | Jeon et al. | 365/145 |
| 2007/0247940 A1* | 10/2007 | Liaw et al. | 365/208 |
| 2011/0058403 A1* | 3/2011 | Hashimoto et al. | 365/145 |

* cited by examiner

*Primary Examiner* — Harry W Byrne
(74) *Attorney, Agent, or Firm* — Alan A. R. Cooper; W. James Brady, III; Frederick J. Telecky, Jr.

(57) ABSTRACT

An FRAM device can comprise a sense amplifier, at least a first bitcell, a first control line, and a second control line. The first bitcell can have a bit line that connects to the sense amplifier via a first isolator and a complimentary bit line that connects to the sense amplifier via a second isolator that is different from the first isolator. The first control line can connect to and control the aforementioned first isolator. And the second control line can connect to and control the second isolator such that the second isolator is independently controlled with respect to the first isolator to facilitate testing the device.

7 Claims, 5 Drawing Sheets

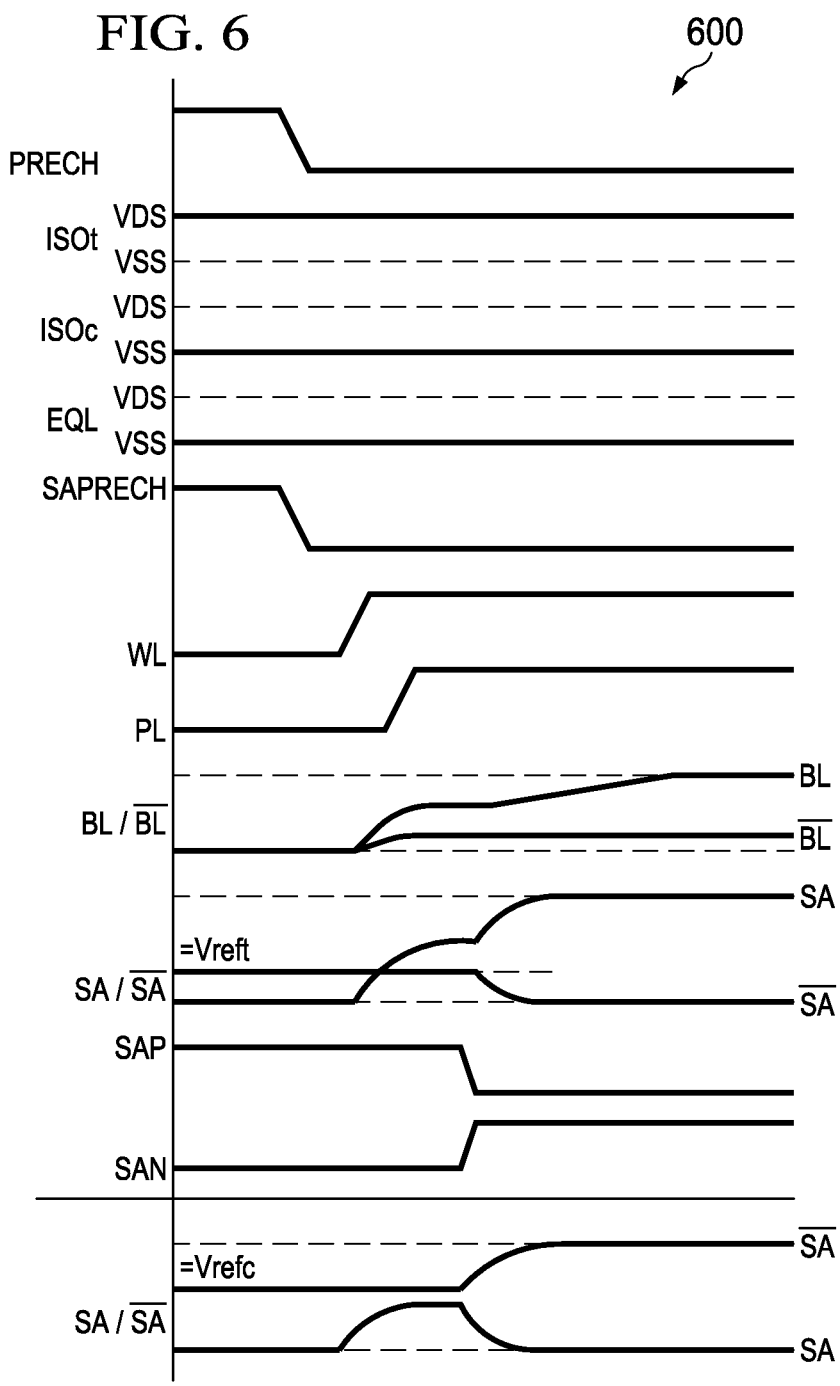

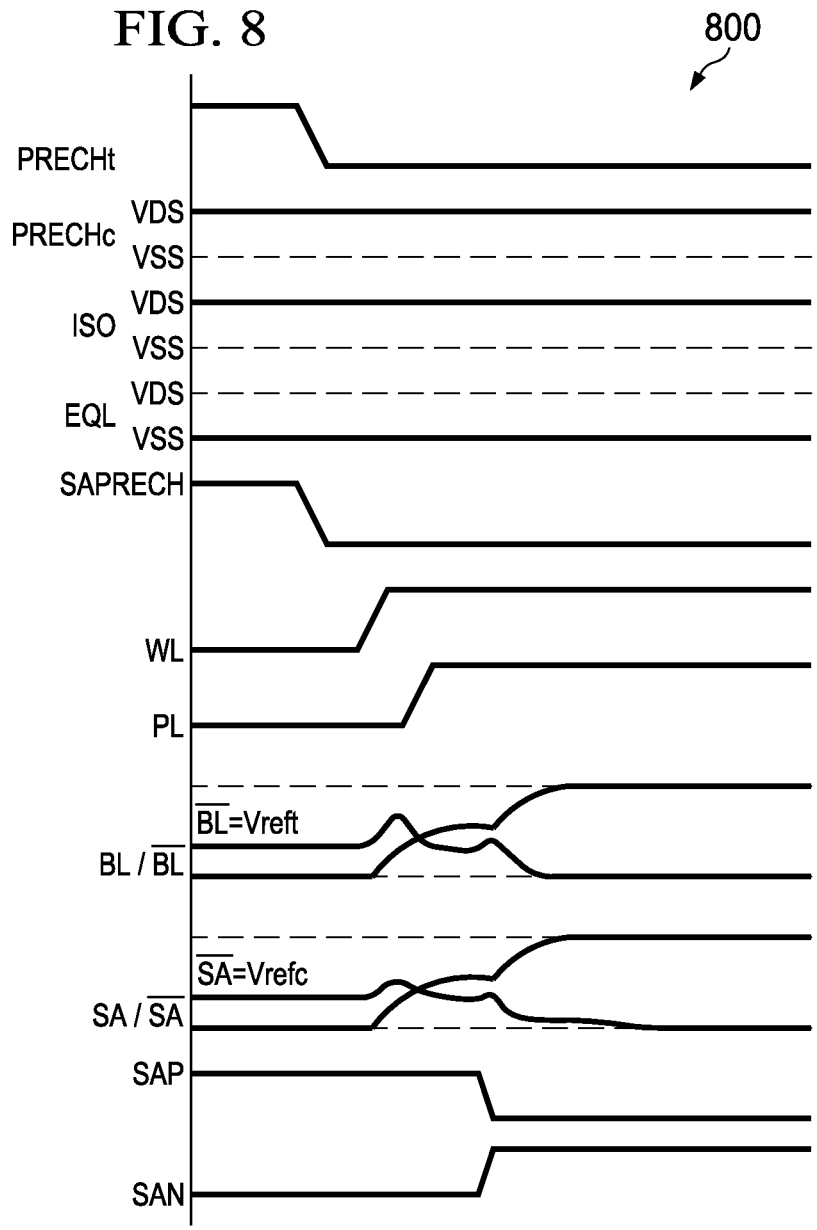

US 8,724,367 B2

METHOD AND APPARATUS PERTAINING TO A FERROELECTRIC RANDOM ACCESS MEMORY

RELATED APPLICATION(S)

This application claims the benefit of U.S. Provisional Application No. 61/428,627 filed Dec. 30, 2010, which is incorporated by reference in its entirety herein.

This application is related to co-pending and co-owned U.S. patent application Ser. No. 13/243,911, entitled METHOD AND APPARATUS PERTAINING TO A FERROELECTRIC RANDOM ACCESS MEMORY filed on Sep. 23, 2011, which is incorporated by reference in its entirety herein.

TECHNICAL FIELD

This invention relates generally to ferroelectric random access memory.

BACKGROUND

Ferroelectric random access memories (FRAMs) are known in the art. FRAMs comprise a non-volatile memory technology that typically operate by changing the polarity of a capacitor dielectric to switch between two stable states having corresponding different capacitive values. These two stable states correspond to stored "1's" and "0's." Reading stored data in an FRAM, however, is typically destructive to the data. As a result, the stored data must be re-written, once read, to persist continued storage of that data.

Unfortunately, the physical requirements to effect such a need tend to represent considerable circuit real estate and also tend to place undesired limits on the maximum speed of operation of such devices. Present practices can also make it challenging to test to efficacy and integrity of an FRAM device. For example, present approaches can present problems with respect to reliably (and/or timely) measuring signal margin for FRAM bitcells in a way that avoids requiring a substantial circuit-area footprint. This, in turn, is at odds with design requirements for ever-smaller and/or ever-denser architectures.

BRIEF DESCRIPTION OF THE DRAWINGS

The above needs are at least partially met through provision of the method and apparatus pertaining to a ferroelectric random access memory described in the following detailed description, particularly when studied in conjunction with the drawings, wherein:

FIG. 6 comprises a timing diagram as configured in accordance with various embodiments of the invention;

FIG. 8 comprises a timing diagram as configured in accordance with various embodiments of the invention.

Figure 1:
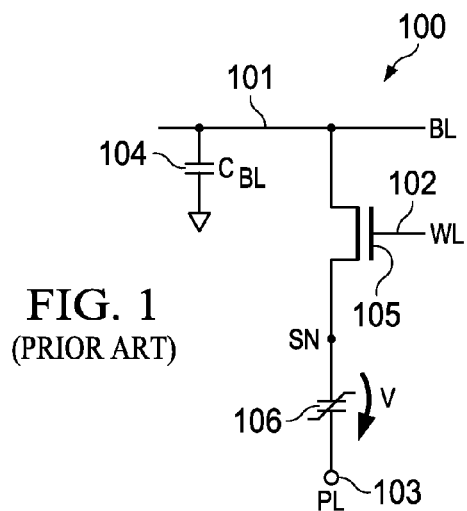
FIG. 1 comprises a schematic diagram as configured in accordance with the prior art.

Elements in the figures are illustrated for simplicity and clarity and have not necessarily been drawn to scale. For example, the dimensions and/or relative positioning of some of the elements in the figures may be exaggerated relative to other elements to help to improve understanding of various embodiments of the present invention. Also, common but well-understood elements that are useful or necessary in a commercially feasible embodiment are often not depicted in order to facilitate a less obstructed view of these various embodiments of the present invention. Certain actions and/or steps may be described or depicted in a particular order of occurrence while those skilled in the art will understand that such specificity with respect to sequence is not actually required. The terms and expressions used herein have the ordinary technical meaning as is accorded to such terms and expressions by persons skilled in the technical field as set forth above except where different specific meanings have otherwise been set forth herein.

SUMMARY

Generally speaking, pursuant to these various embodiments an FRAM device can comprise a sense amplifier, at least a first bitcell, a first control line, and a second control line. The first bitcell can have a bit line that connects to the sense amplifier via a first isolator and a complimentary bit line that connects to the sense amplifier via a second isolator that is different from the first isolator. The first control line can connect to and control the aforementioned first isolator. And the second control line can connect to and control the second isolator such that the second isolator is independently controlled with respect to the first isolator to facilitate testing the device.

By one approach, such a device can have a topology that is not compatible with one transistor/one capacitor (1T1C) operation. The topology may, however, be compatible with 2T2C configurations, 4T2C configurations, or 6T2C configurations.

By one approach the aforementioned bit line and complimentary bit line can be configured to be independently prechargeable to thereby permit precharging the bit line and the complimentary bit line with differing potentials. In such a case, if desired, the bit line can be configured to be precharged (during, for example, a testing mode of operation) to a first voltage for the device and the complimentary bit line can be configured to be precharged (during that testing mode of operation) to a test voltage that is different than that first voltage (such as, but not limited to, a test voltage of choice such as a voltage that is greater than ground but less than the first voltage).

These teachings can be employed with twin-cell architectures (characterized by the storage of both true and complementary data) that use common word lines and shared sense amplifier(s). The common word line will lead to accessing both bit and bit-not information with every cycle and hence transfer charge onto both the bit line and the complimentary bit line. Notwithstanding this architecturally-based design and result, these teachings permit a known/controlled voltage to be applied to one sense amplifier input and data representing only bit or bit-not content to be applied to the remaining sense amplifier input.

As a result, these teachings permit rapid and reliable testing of bitcell efficacy without needing to separate the word line signals for a twin-cell array. This permits the designer to maintain only a single word line driver for each bitcell row in the memory array. This can lead to important and significant savings in space requirements.

DETAILED DESCRIPTION

These and other benefits may become clearer upon making a thorough review and study of the following detailed description. Referring now to the drawings, and in particular to FIG. 1, it may be helpful to first briefly describe certain prior-art practices in these regards before presenting further details regarding the present teachings.

FIG. 1 depicts a fairly standard ferroelectric-capacitor circuit 100 based upon 1T1C topology. This ferroelectric-capacitor circuit 100 connects to a bit line (BL) 101, a word line (WL) 102, and a plate line (PL) 103. A capacitor 104 couples between the bit line 101 and a reference voltage. A series-connected transistor 105 and ferroelectric capacitor 106 are connected between the aforementioned bit line 101 and pulse line 103 (with the junction between these two components being denoted as "SN" to represent a source node). The aforementioned word line 102, in turn, connects to the gate of this transistor 105.

Such a circuit operates by selectively changing the polarization of the material that comprises the ferroelectric capacitor's dielectric. Such a device will typically have at least two stable states that result in differing capacitive values. This difference, in turn, serves to indicate the corresponding storage of either a logical "1" or a "0."

As alluded to above, the stored value of a ferroelectric capacitor is read by applying an electric field. The amount of charge needed to flip the memory cell to the opposite state is measured and the previous state of the cell is revealed. In particular, the capacitor is integrated to establish its value and thereby read its data state. This comprises pulsing the plate line (PL) to transfer a corresponding charge to the relevant bit line. A different voltage value V results depending upon whether the capacitor value is relatively high or low as per the foregoing and the value of this voltage can be compared to a reference value to thereby ultimately differentiate between a stored "1" and a stored "0."

This means, however, that the read operation destroys the memory cell state and has to be followed by a corresponding write operation in order to restore the bit value. In particular, while pulsing the plate line the capacitor's plate is typically pulsed high. As a result, although the stored state can be ascertained (and hence the corresponding data read), this approach comprises a destructive read.

Accordingly, once read, it is typically necessary to rewrite the correct data back into the ferroelectric-capacitor circuit 100. To effect a write operation, and presuming the original data was a "0," the bit line is brought down to zero while the plate line remains high. Discharging the plate line then restores the original desired data state. When the original data was a "1," Vdd is applied to the bit line. The plate line is then discharged to develop a negative potential across the capacitor. Discharging the bit line then brings the capacitor back to the desired state representative of a "1."

Figure 2:
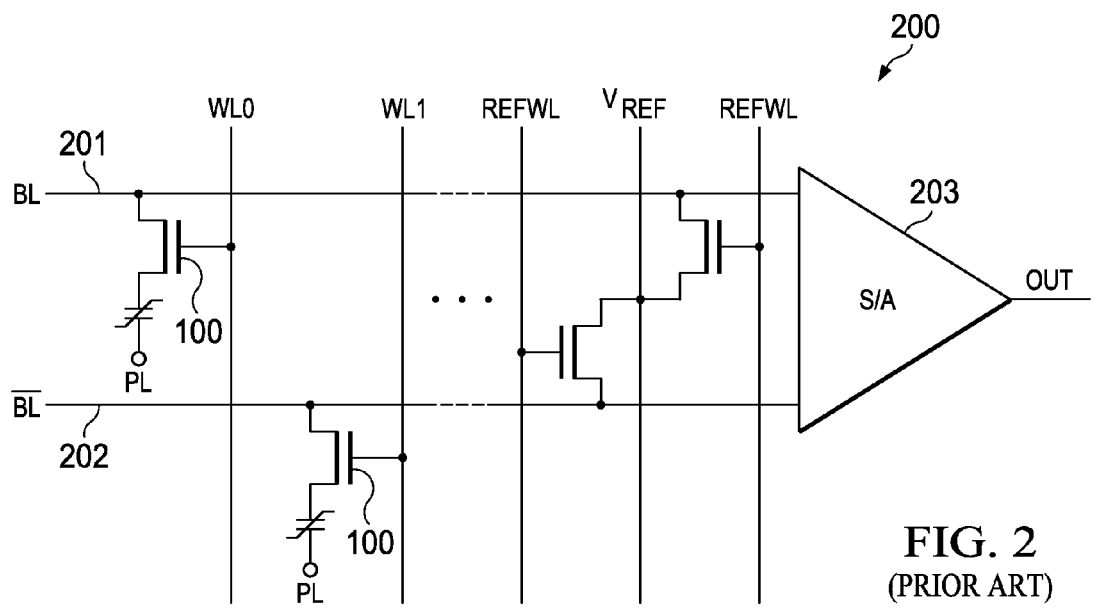
FIG. 2 comprises a schematic diagram as configured in accordance with the prior art.

FIG. 2 illustrates a generally standard application of such a ferroelectric-capacitor circuit 100 using so-called 2T2C topology 200 (also sometimes referred to as a twin-cell or dual-cell approach). In this example a first ferroelectric-capacitor circuit 100 responds to a bit line 201 while the second ferroelectric-capacitor circuit 100 responds instead to a complimentary bit line 202. Similarly, the first ferroelectric-capacitor circuit 100 connects to a first word line (denoted here as WL0) while the second ferroelectric-capacitor circuit 100 connects to a second, different word line (denoted here as WL1).

This 2T2C approach uses the same basic architectural approach as the aforementioned 1T1C topology except now both word lines are utilized to store both the true data as well as a complementary form of that data. Such an approach tends to halve circuit density but effectively doubles the signal that is available for sensing and hence tends to ensure a more reliable memory circuit.

Using such a circuit, a word line can be switched on to thereby place the corresponding data on the appropriate bit line. This, in turn, can be compared to a reference voltage (Vref). So configured, when a word line (such as WL0) is on, the plate line can be pulsed and the bit line will then produce a value that is above or below the reference voltage. A sense amplifier (S/A) 203 can then output a corresponding "1" or "0" to provide the desired read output.

Figure 3:
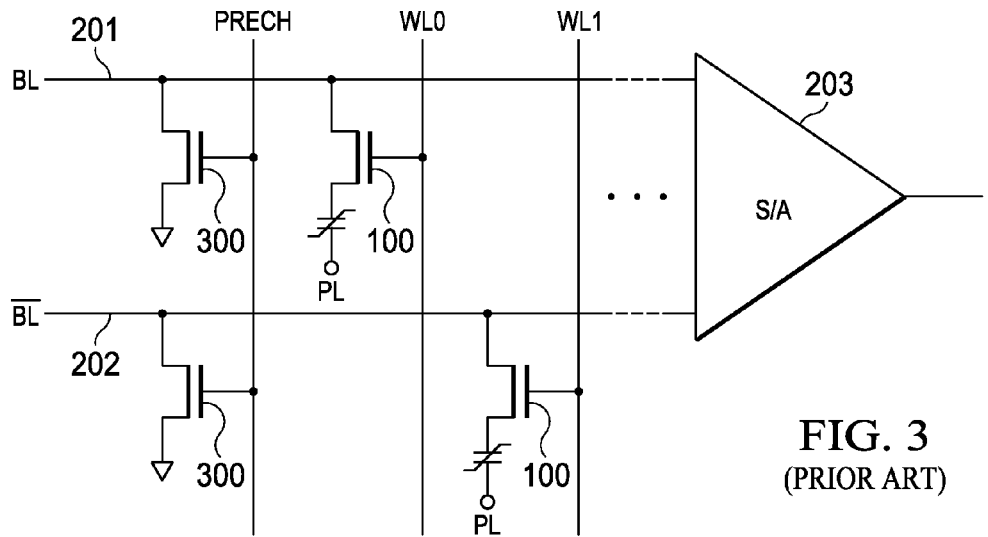
FIG. 3 comprises a schematic diagram as configured in accordance with the prior art.

Though satisfactory for many application settings, these 1T1C and 2T2C topologies present certain operational concerns as well. For example, at the end of the read or write cycle the storage node (SN) must be discharged before the word line is switched low. As another example, and referring now to FIG. 3, at the beginning of a next read or write cycle, the word line turns on while a bit line precharge device 300 is kept on (to facilitate clearing any charge build up).

Figure 4:
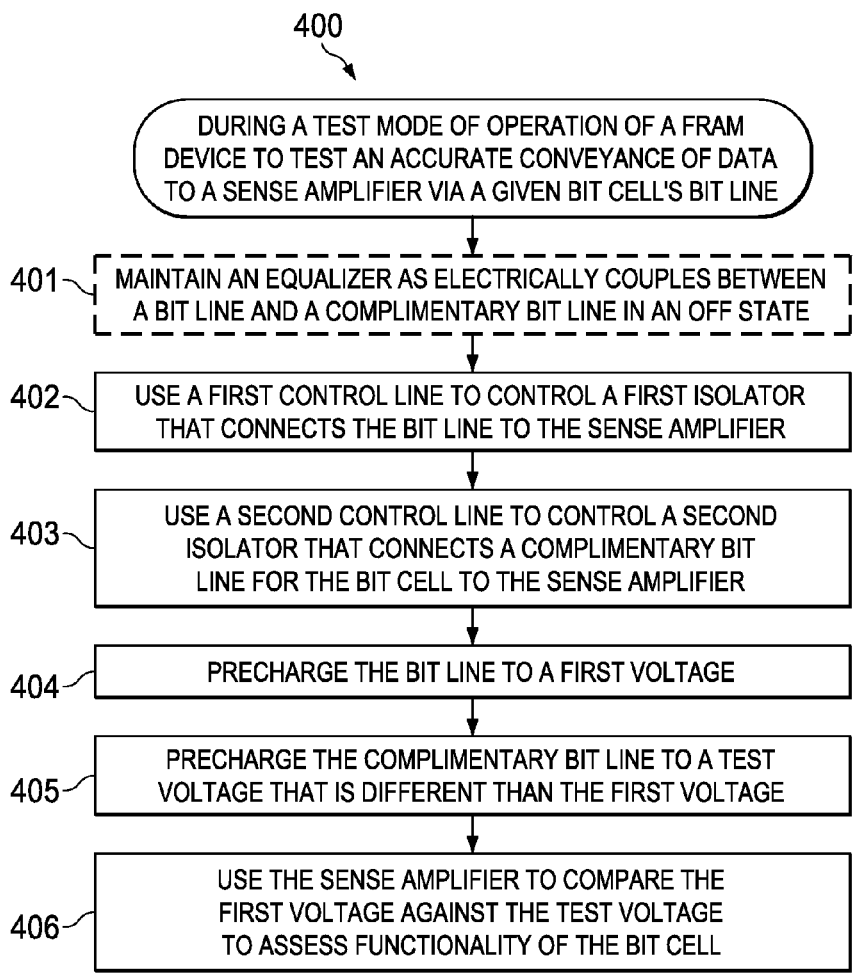
FIG. 4 comprises a flow diagram as configured in accordance with various embodiments of the invention.

To illustrate at least one improvement upon the foregoing, and referring now to FIG. 4, at least a portion of a test mode of operation for an FRAM device will be described followed by a description of various corresponding architectural approaches. It will be understood that this test mode will serve to facilitate testing for an accurate conveyance of data to a sense amplifier via a given bitcell's bit line.

In some cases, these teachings may be applied with FRAM devices that include an equalizer electrically coupled between bit lines and their corresponding complimentary bit lines. In such a case, this process 400 will, as desired, accommodate the optional step 401 of maintaining that equalizer in an off state (during this described portion of the test mode of operation).

In any event, this process 400 provides the step 402 of using a first control line to control a first isolator that connects the bit line to the sense amplifier and the step 403 of using a second control line to control a second isolator that connects a complimentary bit line for the bitcell to that sense amplifier.

At step 404 this process 400 then provides for precharging the bit line to a first voltage. At step 405, this process 400 then provides for precharging the complimentary bit line to a test voltage that is different than that first voltage. By one approach, this test voltage can be greater than ground but less than the first voltage. By one approach, these precharging steps can be in response to a shared control signal.

If desired, this process 400 will also accommodate precharging a bit line input to the sense amplifier and also precharging a complimentary bit line input to the sense amplifier. By one approach, the bit line input to the sense amplifier can be precharged using the aforementioned first voltage while the complimentary bit line input to the sense amplifier can be precharged using the aforementioned test voltage.

In any event, at step 406 the sense amplifier is then used as per ordinary practice in these regards to compare that first voltage against the test voltage to thereby assess functionality of the bitcell.

The following descriptions of some exemplary circuits in these regards offer further information and examples in accordance with these teachings. It will be understood, however, that these examples are offered for the purpose of illustration and are not intended, by their example or their specificity, to suggest any particular limitations with respect to these teachings.

Figure 5:
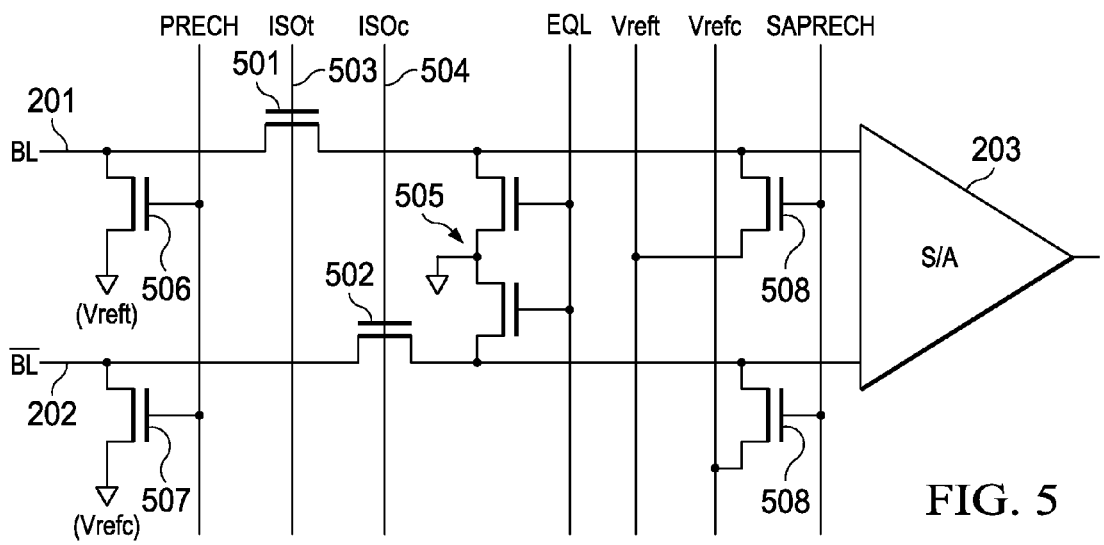
FIG. 5 comprises a schematic diagram as configured in accordance with various embodiments of the invention.

FIG. 5 depicts a first example of an FRAM device in these regards. This example includes a sense amplifier 203 and a first bitcell having a bit line 201 that connects to this sense amplifier 203 via a first isolator 501. This first bitcell also has a complimentary bit line 202 that also connects to the sense amplifier 203, albeit via a second isolator 502 that is different from the first isolator 501. In this example, a first control line (ISOt) 503 connects to and controls this first isolator 501 while a second control line (ISOc) 504, that is different from the first control line 503, connects to and controls the second isolator 502. (Those skilled in the art will recognize that the ferroelectric capacitor circuits described above are not shown here for the sake of clarity and simplicity.)

So configured, the second isolator 502 is independently controlled with respect to the first isolator 501. This, in turn, can facilitate testing of the FRAM device.

As mentioned above, if desired, such a circuit can include an equalizer 505 that electrically couples between the bit line 201 and the complimentary bit line 202. When present, and when facilitating testing of the FRAM device, this equalizer can be maintained in an off state.

FIG. 6 comprises a series of timing diagrams 600 that depict the signal at various points of interest in the FRAM device of FIG. 5. These timing diagrams 600 reveal, for example, that a precharge (PRECH) is applied to both ferroelectric capacitor circuits at the beginning of a test cycle and then removed. Also, and as noted above, the isolator control line (ISOt) for the bit line 201 holds its isolator 501 on while the other isolator control line (ISOc) holds its corresponding isolators 502 off during the test cycle. These diagrams 600 also illustrate that the equalizer control line (EQL) also maintains the equalizer 505 in an off state during the test cycle.

In this example, the bit line and complimentary bit line to the sense amplifier 203 can also be independently precharged. Prechargers 508 effect this precharging in response to a corresponding SAPRECH control signal.

Following the aforementioned precharging events, the word line goes high followed in short order by the plate line. In this example it is presumed that the stored data is a "1" and accordingly the bit line and the complimentary bit line then reach the relative values shown such that the bit line has a considerably higher amplitude than the complimentary bit line. The sense amplifier bit line and complimentary bit line inputs therefore reach the relative values shown (where SA exceeds the VREFc value and the compliment of SA becomes less than this value) and the sense amplifier outputs a "1."

In a case where the stored data comprises a "0," the final timing diagram of FIG. 6 depicts the sense amplifier result, where the compliment of SA now exceeds VREFc while SA is, and remains, less than this value.

In the illustrative example shown in FIG. 5, both the bit line and the complimentary bit line are charged via a shared, common precharge control signal (PRECH) that is applied to corresponding precharging transistors 506 and 507. The bit line is charged to a first voltage denoted in FIG. 5 as Vreft while the complimentary bit line is charged to a test voltage (denoted in FIG. 5 as Vrefc) that is different from the first voltage. This test voltage can, for example, be less than the first voltage (albeit greater than ground).

Figure 7:
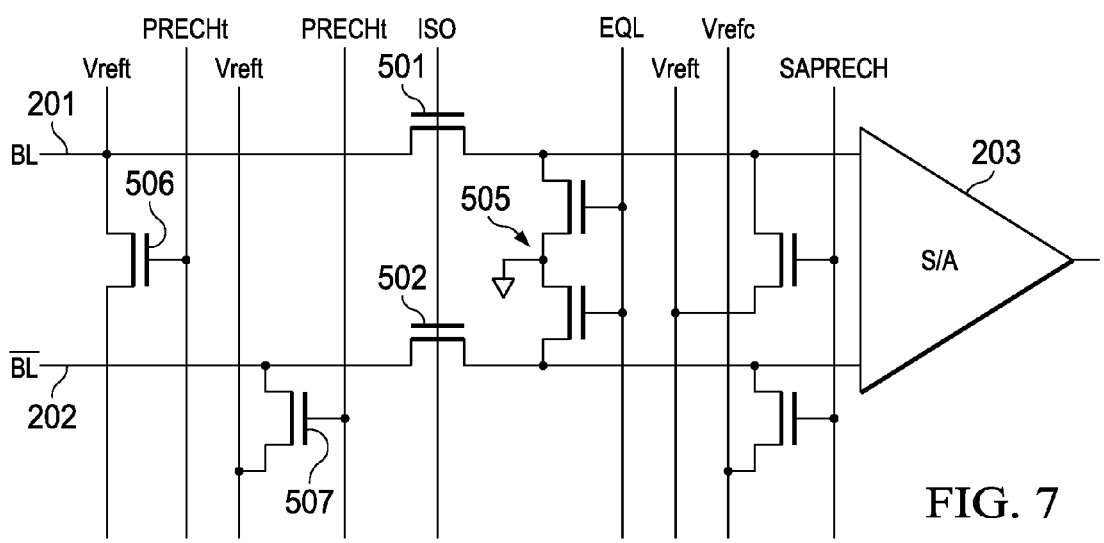
FIG. 7 comprises a schematic diagram as configured in accordance with various embodiments of the invention.

If desired, and as illustrated in FIG. 7, these precharging transistors 506 and 507 can be independently controlled. For example, as shown, the precharging transistor 506 for the bit line can be controlled by a PRECHt control line while the precharging transistor 507 can be controlled by a separate PRECHc control line.

Referring now to FIG. 8, the timing diagrams 800 as correspond to the circuit shown in FIG. 7 exhibits operational differences from the timing diagrams 600 of FIG. 6 described above in that, while now the precharging of the bit line proceeds as described previously, the precharging of the complimentary bit line remains continuous during the test cycle. The beneficial results of this approach are particular evident when considering that the bit line and complimentary bit line now reach their desired states considerably more quickly and assuredly. As a result, the test cycle can be temporally reduced while still retaining reliable results.

Using such approaches FRAM bitcells can be reliably (and often quickly) tested and screened to identify bitcells exhibiting insufficient signal margin. This information can serve, for example, to identify parts that should be scrapped or to identify specific bitcells that can/should be replaced by available redundant capabilities.

Those skilled in the art will recognize that a wide variety of modifications, alterations, and combinations can be made with respect to the above described embodiments without departing from the spirit and scope of the invention, and that such modifications, alterations, and combinations are to be viewed as being within the ambit of the inventive concept.

What is claimed is:

1. A ferroelectric random access memory (FRAM) device, the device comprising:
    a sense amplifier;
    at least a first bit cell having a bit line that connects to the sense amplifier via a first isolator and a complimentary bit line that connects to the sense amplifier via a second isolator that is different from the first isolator;
    a first control line that connects to and controls the first isolator;
    a second control line, that is different from the first control line, that connects to and controls the second isolator such that the second isolator is independently controlled with respect to the first isolator to facilitate testing the device.

2. The FRAM device of claim 1 wherein the device has a topology that is not compatible with one transistor/one capacitor (1T1C) operation.

3. The FRAM device of claim 1 wherein the bit line and the complimentary bit line are configured to be independently prechargeable to thereby permit precharging the bit line and the complimentary bit line with differing potentials.

4. The FRAM device of claim 3 wherein the bit line is configured to be precharged, during a testing mode of operation, to a first voltage for the device and the complimentary bit line is configured to be precharged, during the testing mode of operation, to a test voltage that is different than the first voltage.

5. The FRAM device of claim 4 wherein:
    a bit line input to the sense amplifier is configured to be precharged, during the testing mode of operation, to the first voltage for the device; and
    a complimentary bit line input to the sense amplifier is configured to be precharged, during the testing mode of operation, to the test voltage.

6. The FRAM device of claim 4 wherein the test voltage is greater than ground and less than the first voltage.

7. A ferroelectric random access memory (FRAM) device comprised of a plurality of bit cells, wherein at least many of the plurality of bit cells each comprises:
    a sense amplifier;

a bit line that connects to the sense amplifier via a first isolator and a complimentary bit line that connects to the sense amplifier via a second isolator that is different from the first isolator;

a first control line that connects to and controls the first isolator;

a second control line, that is different from the first control line, that connects to and controls the second isolator such that the second isolator is independently controlled with respect to the first isolator to facilitate testing the device;

a controllable equalizer that is electrically coupled between the bit line and the complimentary bit line;

a first precharger that is configured to selectively precharge the bit line to a first voltage;

a second precharger, that is different from the first precharger, that is configured to selectively precharge the complimentary bit line to a test voltage, wherein the test voltage is different than the first voltage;

a precharge control line that connects to both the first precharger and the second precharger.

* * * * *